US006710340B2

(12) United States Patent
Kazumori

(10) Patent No.: US 6,710,340 B2
(45) Date of Patent: Mar. 23, 2004

(54) SCANNING ELECTRON MICROSCOPE AND METHOD OF DETECTING ELECTRONS THEREIN

(75) Inventor: Hiroyoshi Kazumori, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 10/072,805

(22) Filed: Feb. 8, 2002

(65) Prior Publication Data

US 2003/0150991 A1 Aug. 14, 2003

(51) Int. Cl.⁷ .................. H01J 37/244; H01J 37/141
(52) U.S. Cl. .................. 250/310; 250/396 ML
(58) Field of Search .................. 250/310, 396 ML

(56) References Cited

U.S. PATENT DOCUMENTS 5,412,209 A * 5/1995 Otaka et al. .................. 250/310
6,043,491 A * 3/2000 Ose et al. ..................... 250/310
6,335,530 B1 * 1/2002 Takaoka et al. ..... 250/396 ML

FOREIGN PATENT DOCUMENTS

JP          11 111211          4/1999

* cited by examiner

Primary Examiner—John R. Lee
Assistant Examiner—Paul M. Gurzo
(74) Attorney, Agent, or Firm—Webb Ziesenheim Logsdon Orkin & Hanson, P.C.

(57) ABSTRACT

There is disclosed a scanning electron microscope capable of detecting secondary electrons emitted from a specimen, using a semi-in-lens type objective lens. A voltage is applied to the specimen from a power supply to decelerate the electron beam immediately ahead of the specimen. Secondary electrons produced from the specimen are confined by a magnetic lens field and move spirally upward. The secondary electrons moving upward travel linearly from a location where the magnetic field of the objective lens is weak. Then, the electrons strike first and second conversion electrodes, producing a large amount of secondary electrons. A voltage is applied to the front face of a detector to produce an electric field near the first opening in the inner polepiece. This field directs the secondary electrons toward the detector, where they are detected.

11 Claims, 1 Drawing Sheet

SCANNING ELECTRON MICROSCOPE AND METHOD OF DETECTING ELECTRONS THEREIN

BACKGROUND OF THE INVENTION

1. Field of the Invention

The present invention relates to a scanning electron microscope in which an electron beam is focused by an objective lens producing a magnetic field leaking onto a specimen and in which secondary electrons and other electrons emitted from the specimen are detected. The invention also relates to a method of detecting electrons in this scanning electron microscope.

2. Description of Related Art

In a scanning electron microscope, the geometry of the objective lens is an important factor in determining the resolution of the instrument. To improve the resolution, the aberration coefficient of the objective lens must be reduced. Accordingly, a high-resolution scanning electron microscope is known in which the aberration coefficient is reduced to less than 3 mm, for example, by the use of an objective lens of in-lens or semi-in-lens type in which the magnetic field on the specimen is strengthened.

In the above-described semi-in-lens type objective lens, a single magnetic lens field is formed below the lower end surfaces of the inner and outer polepieces. In this case, the specimen is placed within this lens field, and a high-resolution secondary electron image can be observed.

Furthermore, in an attempt to reduce the effects of objective lens aberration, a retarding method has been put into practical use. In particular, the energy of the primary electron beam is increased, and the beam is introduced into the objective lens range. The beam is decelerated immediately ahead of the specimen. This method has the advantage that the resolution is enhanced further at low accelerating voltages.

In the retarding method described above, it is customary to use a scintillator or microchannel plate placed above the objective lens to detect secondary electrons or back-scattered electrons emitted from the specimen.

Sometimes, a secondary electron detector is placed above deflection coils, which in turn are located above the objective lens. In this case, secondary electrons are deflected by the deflection coils, resulting in a decrease in the detection efficiency.

Where the retarding method is adopted, produced secondary electrons are accelerated by the accelerating field between the specimen to which a negative voltage is applied and surrounding members that are at ground potential. Since the secondary electrons move upward with high energies, it is relatively difficult to direct the secondary electrons toward the detector and detect them within the objective lens. Where a scintillator or microchannel plate is placed near the optical axis between the objective lens and the deflection coil assembly, imaging is hindered, especially at low magnifications. In particular, if the electron beam is deflected through a large angle for low-magnification imaging, the electron beam is scanned beyond the electron passage hole in the microchannel plate or in an aperture plate. Therefore, the beam is cut off by other than the electron beam passage port. As a result, the resulting low-magnification image lacks its peripheral portion and thus consists only of its central portion.

SUMMARY OF THE INVENTION

In view of the foregoing, the present invention has been made. It is an object of the present invention to provide a scanning electron microscope which is equipped with a semi-in-lens objective lens and capable of detecting secondary electrons at a high efficiency, the electrons being emitted from a specimen.

A scanning electron microscope in accordance with the present invention has an inner polepiece, an outer polepiece, and an objective lens that form a magnetic lens field leaking onto a surface of a specimen below the lower end surfaces of the polepieces. The objective lens focuses an electron beam onto the specimen. The inner polepiece is provided with a first opening above the lower end surface of the inner polepiece. A detector is mounted outside the inner polepiece to detect secondary electrons passed through the opening. This microscope is characterized in that a negative voltage is applied to the specimen to form a decelerating electric field for decelerating the electron beam near the surface of the specimen and that a conversion electrode is mounted around an electron beam passage within the objective lens. Secondary electrons emitted from the specimen impinge on the conversion electrode. Secondary electrons produced from the conversion electrode are guided to the secondary electron detector via the first opening and detected.

In the present invention, the negative voltage is applied to the specimen to form the electric field that decelerates the electron beam, the field being positioned near the specimen surface. This reduces the effects of the objective lens aberration. The conversion electrode on which secondary electrons emitted from the specimen impinge is mounted around the electron beam passage within the objective lens. Secondary electrons produced from the conversion electrode are guided to the secondary electron detector via the first opening and detected.

Preferably, the conversion electrode is cylindrical and has an inner surface that produces secondary electrons at a high efficiency. It is desirable that the conversion electrode be a single cylindrical electrode. A second opening is preferably formed in the portion of the inner polepiece that faces the first opening. The conversion electrode may be split into upper and lower parts arranged above and below, respectively, the first opening. In this case, it is not necessary to form the first opening in the conversion electrode.

An attracting electrode to which a positive potential is applied to attract secondary electrons may be positioned near the incident surface of the secondary electron detector. A potential between the specimen potential and the potential at the attracting electrode may be applied to the conversion electrode.

Other objects and features of the invention will appear in the course of the description thereof, which follows.

DESCRIPTION OF THE PREFERRED EMBODIMENTS

Figure 1:
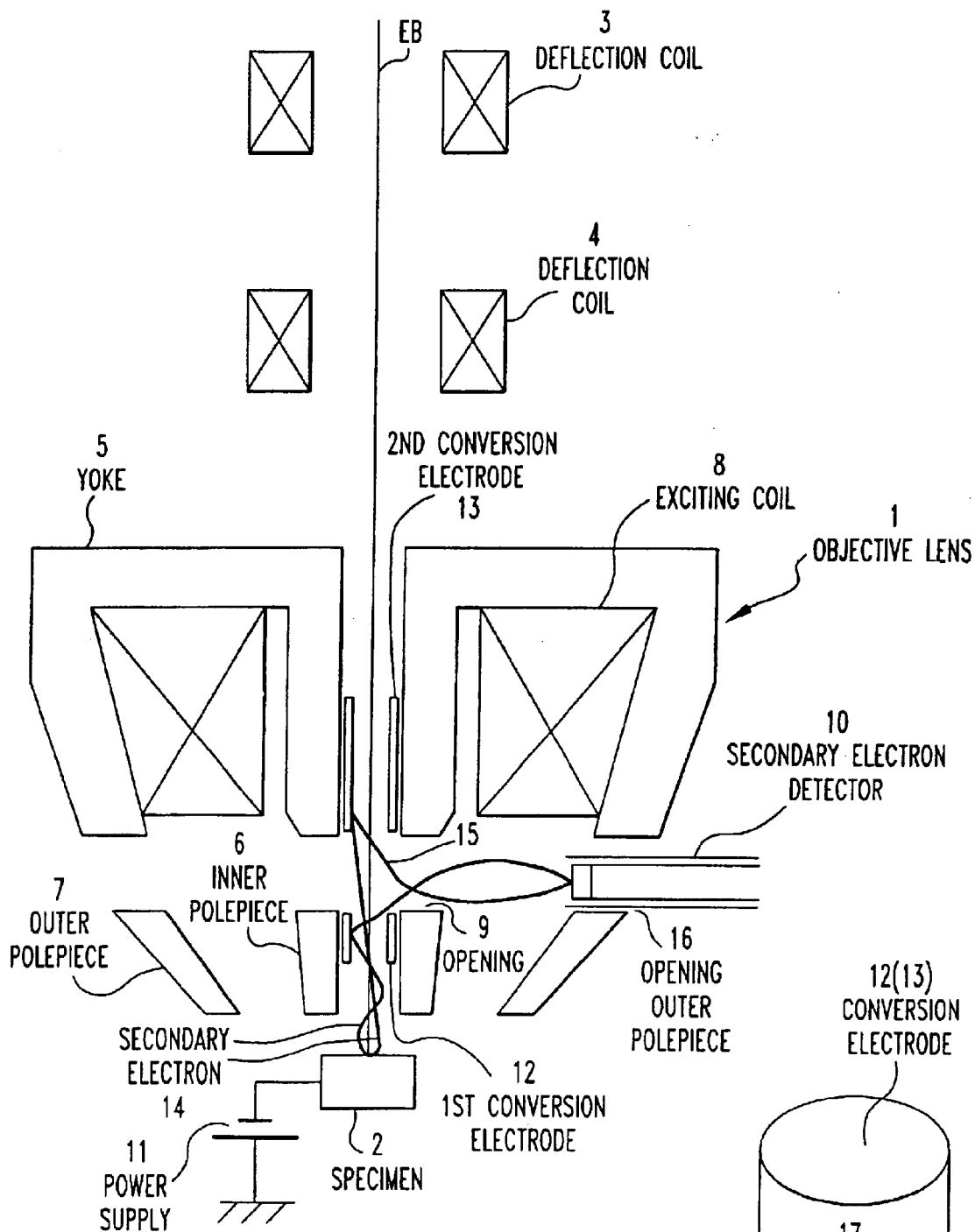
FIG. 1 is a vertical cross-sectional view of main portions of a scanning electron microscope in accordance with the present invention.

Embodiments of the present invention are hereinafter described in detail by referring to the drawings. FIG. 1 shows main portions of a scanning electron microscope according to the present invention. An electron beam EB emitted from an electron gun (not shown) and having a given energy is sharply focused onto a specimen 2 by a system of condenser lenses (not shown) and an objective lens 1.

The electron beam EB is deflected by deflection coils 3 and 4 and scanned across the specimen 2 in two dimensions. Two-dimensional scan signals are supplied to the deflection coils 3 and 4 from a scan signal generator circuit (not shown).

The objective lens 1 is composed of a yoke 5, a cylindrical inner polepiece 6 directly surrounding an electron beam passage, an outer polepiece 7 disposed around the inner polepiece 6, and exciting coil 8. The lower ends of the polepieces are substantially flush with each other.

The inner polepiece 6 is provided with two or four openings 9 near its lower end to impart axisymmetry to the structure of the objective lens and to cause the distribution of the produced magnetic lens field to show rotational symmetry about its axis. The outer polepiece 7 is provided with openings 16 corresponding in position to the openings 9 in the inner polepiece 6. A secondary electron detector 10 is inserted between the inner and outer polepieces through one of the openings 16.

The secondary electron detector 10 is a combination of a scintillator and a photomultiplier tube. An annular electrode is mounted around the circular scintillator. A positive attracting voltage is applied to the annular electrode to attract secondary electrons. The value of the positive voltage is set to about 10 kV, for example. The output signal from the secondary electron detector 10 is amplified by an amplifier (not shown) and supplied to a display unit such as a CRT (not shown) directly or via a memory.

A power supply 11 is connected with the specimen 2 to apply a negative voltage to the specimen 2, for decelerating the electron beam EB. A first conversion electrode 12 and a second conversion electrode 13 that are cylindrical are positioned inside the inner polepiece 6. The first conversion electrode 12 is located under the openings 9, i.e., between the height of the openings 9 and the lower end of the inner polepiece 6. The second conversion electrode 13 is positioned above the openings 9. The conversion electrodes 12 and 13 are placed at ground potential. The inner surfaces of the first and second conversion electrodes 12, 13 are coated with a material producing secondary electrons at a high efficiency, such as a heavy-element material. The operation of the instrument constructed in this way is as follows.

Where a secondary electron image should be observed, given scan signals are supplied to the deflection coils 3 and 4 from the scan signal generator circuit (not shown). A desired two-dimensional area on the specimen 2 is raster-scanned by the electron beam EB.

The accelerating voltage of the electron beam EB impinging on the specimen 2 is set to 4 kV, for example. The electron beam having a relatively high energy of about 4 keV is introduced into the objective lens 1. Because a voltage of −3 kV, for example, is applied to the specimen 2 from the power supply 11, the electron beam EB is decelerated immediately ahead of the specimen and hits the specimen 2 at an energy of about 1 keV.

The objective lens 1 is so constructed that a single magnetic lens field is produced below the lower end surfaces of the inner and outer polepieces 6, 7. The specimen 2 is placed within this lens field. As the electron beam hits the specimen 2, secondary electrons 14 are produced from it. The secondary electrons 14 are confined by the lens field and move spirally upwardly near the center axis of the objective lens 1.

A voltage of −3 kV is applied to the specimen 2. Since all the members, such as the polepieces around the specimen, are at ground potential, secondary electrons emitted from the specimen are accelerated by the potential difference. As a result, the energy of the secondary electrons 14 is 3 keV corresponding to the voltage −3 kV applied to the specimen 2. The secondary electrons 14 moved upward make a linear motion from a location where the strength of the magnetic field of the objective lens 1 is weak (i.e., from around the center axis) toward the surroundings. Then, the secondary electrons collide against the first conversion electrode 12 and second conversion electrode 13 that are at ground potential. As a result, a large amount of secondary electrons 15 are produced from the conversion electrodes 12 and 13.

Furthermore, electrons back-scattered from the specimen 2 move upward with energies of 3 keV or more. They collide against the first conversion electrode 12 and second conversion electrode 13 at ground potential in the same way as the secondary electrons. A large amount of secondary electrons 15 are emitted from the conversion electrodes 12 and 13.

The attracting voltage applied to the front face of the detector 10 produces an attracting electric field in the vicinity of one of the openings 9 in the inner polepiece 6. The secondary electrons 15 emitted from the conversion electrodes 12 and 13 at ground potential have low energies on the order of tens of kilovolts. These low-energy secondary electrons 15 are attracted by the attracting field, pass through the openings 9, and move toward the detector 10. They strike the scintillator in the secondary electron detector 10, producing light that is detected by the photomultiplier tube.

The output signal from the photomultiplier tube is supplied to the display unit directly or via the amplifier (not shown). A secondary electron image of the area on the specimen 2 scanned by the electron beam is displayed on the display unit.

A magnetic field is produced near the openings 9 formed in the inner polepiece 6 and acts to converge the secondary electrons. Therefore, the secondary electrons passed through the openings 9 toward the secondary electron detector 10 are converged and more efficiently captured by the detector.

The configuration of FIG. 1 can enhance the efficiency at which electrons emitted from the specimen are detected while suppressing the effects of the aberration coefficient of the objective lens 1. Note that the inside diameters of the conversion electrodes 12 and 13 are of importance. Where these inside diameters are small, if the electron beam EB is deflected at a large angle under a low-magnification image observation, the electron beam will strike the conversion electrodes. Therefore, it is necessary to determine the inside diameters of the conversion electrodes 12 and 13 according to the deflection range of the electron beam EB.

Preferably, the voltage applied to the specimen 2 is made lower, for the following reasons. The specimen stage must be so designed as to be insulated against high voltages. More importantly, the energies of the secondary electrons or back-scattered electrons striking the conversion electrodes 12 and 13 should make high the efficiency at which secondary electrons are emitted from the inner surfaces of the conversion electrodes. Generally, the energy range within which secondary electrons are emitted from conversion electrodes is in the neighborhood of 1 keV. Taking these into consideration, the voltage applied to the specimen 2 is preferably set to less than −3 keV.

Figure 2:
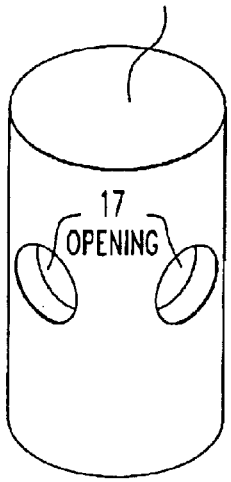
FIG. 2 is a perspective view of a conversion electrode different from the conversion electrode mounted in the microscope shown in FIG. 1.

While an embodiment of the present invention has been described thus far, the invention is not limited to the form shown in FIG. 1. In the above embodiment, the inner surfaces of the conversion electrodes are coated with a material that produces secondary electrons at a high efficiency. The conversion electrodes themselves may be made of a material (e.g., a heavy element) producing secondary electrons at a high efficiency. Furthermore, in the above embodiment, the conversion electrode is split into two parts. As shown in FIG. 2, the conversion electrode may be made of a single cylindrical conversion electrode. Second openings 17 may be formed in the portions of the conversion electrode which adjoin the first-mentioned openings 9. Where four, for example, second openings 17 are formed in conformity with the first-mentioned openings 9, the rotational symmetry of the distribution of the electric field produced inside the conversion electrode with respect to its axis is enhanced with desirable results.

In addition, in the above embodiments, the conversion electrode or electrodes are at ground potential. The potential is not limited to this example. An appropriate positive or negative potential between the negative voltage (e.g., −3 kV) applied to the specimen and the attracting voltage (e.g., +10 kV) applied to the secondary electron detector may be applied.

As described thus far, the present invention provides a scanning electron microscope which uses a semi-in-lens type objective lens and is characterized in that a negative voltage is applied to a specimen to produce a decelerating electric field near the specimen surface in order to reduce the effects of the aberration coefficient of the objective lens and that a conversion electrode is mounted inside the objective lens. Secondary electrons emitted from the specimen are made to strike the conversion electrode, producing secondary electrons which are detected. Consequently, secondary electrons from the specimen can be detected efficiently.

Furthermore, no decelerating electrode is mounted inside the objective lens or close to the bottom surface of the objective lens. Therefore, the front end of the objective lens can be conically shaped. This further reduces the effects of the aberration coefficient of the objective lens. In addition, the secondary electron detector is disposed inside the objective lens. This makes it unnecessary to place a secondary electron detector, such as a scintillator or MCP (multichannel plate) close to the optical axis of the electron beam. When the electron beam is deflected at a large angle under a low-magnification image observation, the electron beam is prevented from being cut off.

Having thus described my invention with the detail and particularity required by the Patent Laws, what is desired protected by Letters Patent is set forth in the following claims.

The invention claimed is:

1. A scanning electron microscope having an inner polepiece, an outer polepiece, an objective lens forming a magnetic lens field leaking onto a surface of a specimen located under lower end surfaces of the polepieces, the objective lens acting to focus an electron beam onto the specimen, a first opening formed in the inner polepiece and located above the lower end surface of the inner polepiece, and a secondary electron detector mounted outside the inner polepiece to detect secondary electrons passed through the first opening,
wherein a negative voltage is applied to the specimen to produce a decelerating electric field near the surface of the specimen to decelerate the electron beam,
wherein there is provided a conversion electrode on which secondary electrons emitted from the specimen impinge, the conversion electrode being mounted around an electron beam passage inside the objective lens, and
wherein secondary electrons emitted from said conversion electrode are guided via said first opening to said secondary electron detector and detected.

2. The scanning electron microscope of claim 1, wherein said conversion electrode is cylindrical and has an inner surface producing secondary electrons at a high efficiency.

3. The scanning electron microscope of claim 2, wherein said inner surface producing secondary electrons at a high efficiency contains a heavy-element material.

4. The scanning electron microscope of claim 1, wherein said conversion electrode is a single cylindrical electrode provided with second openings in portions facing said first openings.

5. The scanning electron microscope of claim 4, wherein a plurality of said first openings are formed in said inner electrode and they are arranged in rotational symmetry about an axis, and wherein a plurality of said second openings are formed in portions of said conversion electrode which face said first openings.

6. The scanning electron microscope of any one of claims 1–3, wherein said conversion electrode is split into two parts located above and below, respectively, said first opening.

7. The scanning electron microscope of claim 1, wherein a negative voltage having an absolute value of less than 3 kV is applied to the specimen.

8. The scanning electron microscope of any one of claims 1–3, wherein an attracting electrode to which a positive potential is applied to attract secondary electrons is mounted near an incident surface of said secondary electron detector, and wherein a potential between a potential at the specimen and the potential at the attracting electrode is applied to said conversion electrode.

9. The scanning electron microscope of claim 8, wherein ground potential is applied to said conversion electrode.

10. The scanning electron microscope of claim 8, wherein a positive or negative potential is applied to said conversion electrode.

11. A method of detecting electrons produced from a specimen in a scanning electron microscope having an inner polepiece, an outer polepiece, an objective lens for producing a magnetic lens field leaking onto a surface of a specimen located below lower end surfaces of the polepieces, a first opening formed in the inner polepiece above the lower end surface of the inner polepiece, and a secondary electron detector for detecting secondary electrons passed through the first opening, said detector being located outside said inner polepiece, said objective lens acting to focus an electron beam onto the specimen, said method comprising the steps of:
applying a negative potential to the specimen to form a decelerating electric field near the surface of the specimen to decelerate the electron beam;
scanning the specimen with the electron beam under this condition;
confining electrons emitted from the specimen by said magnetic lens field;
causing the confined electrons to move upward into a location where the magnetic lens field is weak;
causing the electrons having relatively high energies to move toward surroundings from said location;
causing the electrons moving toward the surroundings to impinge on a conversion electrode located around an electron beam passage inside said inner polepiece;
guiding secondary electrons having relatively low energies produced from said conversion electrode to said secondary electron detector via said first opening; and
detecting the secondary electrons by said secondary electron detector.

* * * * *